(12) United States Patent
Nishimura

(10) Patent No.: US 6,608,577 B2
(45) Date of Patent: Aug. 19, 2003

(54) DIGITAL/ANALOG CONVERTER INCLUDING MOS TRANSISTOR TYPE CURRENT SWITCHES

(75) Inventor: Kouichi Nishimura, Tokyo (JP)

(73) Assignee: NEC Electronics Corporation, Kawasaki Kanagawa (JP)

(*) Notice: Subject to any disclaimer, the term of this patent is extended or adjusted under 35 U.S.C. 154(b) by 0 days.

(21) Appl. No.: 09/888,436

(22) Filed: Jun. 26, 2001

(65) Prior Publication Data

US 2002/0008653 A1 Jan. 24, 2002

(30) Foreign Application Priority Data

Jun. 27, 2000 (JP) ........................................ 2000-193056

(51) Int. Cl.[7] .............................................. H03M 1/66
(52) U.S. Cl. ...................................... 341/144; 341/145
(58) Field of Search ................................ 341/144, 145, 341/143

(56) References Cited

U.S. PATENT DOCUMENTS 5,227,793 A * 7/1993 Aisu .......................... 341/136
5,859,606 A * 1/1999 Schrader et al. ............ 341/144
6,246,351 B1 * 6/2001 Yilmaz ........................ 341/145

FOREIGN PATENT DOCUMENTS

JP            57-83924          5/1982

* cited by examiner

Primary Examiner—Peguy JeanPierre
Assistant Examiner—Joseph J Lauture

(57) ABSTRACT

In a digital/analog converter, a digital-to-analog converting section includes a constant current source circuit having a plurality of binary-coding weighted current output terminals and including a plurality of MOS transistor type current switches driven by digital input signals. Each of the MOS transistor type current switches is connected between one of the binary-coding weighted current terminals and an analog output current terminal. A reference voltage generating section generates at least one reference voltage and supplies it to the constant current source circuit. A current-to-voltage converting section converts an analog output current flowing through the analog output current terminal into an analog output voltage in response to the analog output current and supplies the analog output voltage to an analog output voltage terminal.

22 Claims, 17 Drawing Sheets

$I_{SS} = 128 \mu A$ $I_{SS} = 1 \mu A$

DIGITAL/ANALOG CONVERTER INCLUDING MOS TRANSISTOR TYPE CURRENT SWITCHES

BACKGROUND OF THE INVENTION

1. Field of the Invention

The present invention relates to a digital/analog (D/A) converter.

2. Description of the Related Art

In a prior art D/A converter (see: JP-A-57-83924), a digital-to-analog converting section includes a constant current source circuit having a plurality of binary-coding weight current output terminals and including a plurality of bipolar transistor type current switches driven by digital input signals. Each of the bipolar transistor type current switches is connected between one of the binary-coding weighted current terminals and an analog output current terminal. A reference voltage generating section generates at least two reference voltages and supplies them to the constant current source circuit. Particularly, one of the reference voltages is supplied to the bipolar transistor type current switches. A current-to-voltage converting section converts an analog output current flowing through the analog output current terminal into an analog output voltage in response to the analog output current and supplies the analog output voltage to an analog output voltage terminal. This will be explained later in detail.

In the above-described prior art D/A converter, however, since the current switches use bipolar transistors, collector currents flowing through the bipolar transistors, which contributes to the analog output current, are smaller than emitter currents flowing through the bipolar transistors. Therefore, in order to compensate for the caused error, an additional reference voltage source is provided in the reference voltage generating circuit, which makes the D/A converter more complex, thus increasing the manufacturing cost. Additionally, in order to operate the bipolar transistors of the current switches in a non-saturated state, a control circuit for adjusting the binary data signal is required, which also makes the D/A converter more comples. Thus, the manufacturing cost is further increased.

Also, in the above-described prior art D/A converter, since the analog output current of the D/A converting section is directly supplied to the current-to-voltage reference voltage generating section, the D/A converter is disadvantageous in terms of lowering the power supply voltage of the D/A converter.

SUMMARY OF THE INVENTION

It is an object of the present invention to provide a simplified D/A converter with a wide dynamic output range.

According to the present invention, in a D/A converter, a digital-to-analog converting section includes a constant current source circuit having a plurality of binary-coding weighted current output terminals and including a plurality of MOS transistor type current switches driven by digital input signals. Each of the MOS transistor type current switches is connected between one of the binary-coding weighted current terminals and an analog output current terminal. A reference voltage generating section generates at least one reference voltage and supplies it to the constant current source circuit. A current-to-voltage converting section converts an analog output current flowing through the analog output current terminal into an analog output voltage in response to the analog output current and supplies the analog output voltage to an analog output voltage terminal.

Also, a current mirror circuit is connected between the analog output current terminal and the current-to-voltage converting section.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiment, a prior art D/A converter will be explained with reference to FIGS. 1, 2A through 2E, 3A through 3D, 4 and 5 (see JP-A-57-83924).

Figure 1:
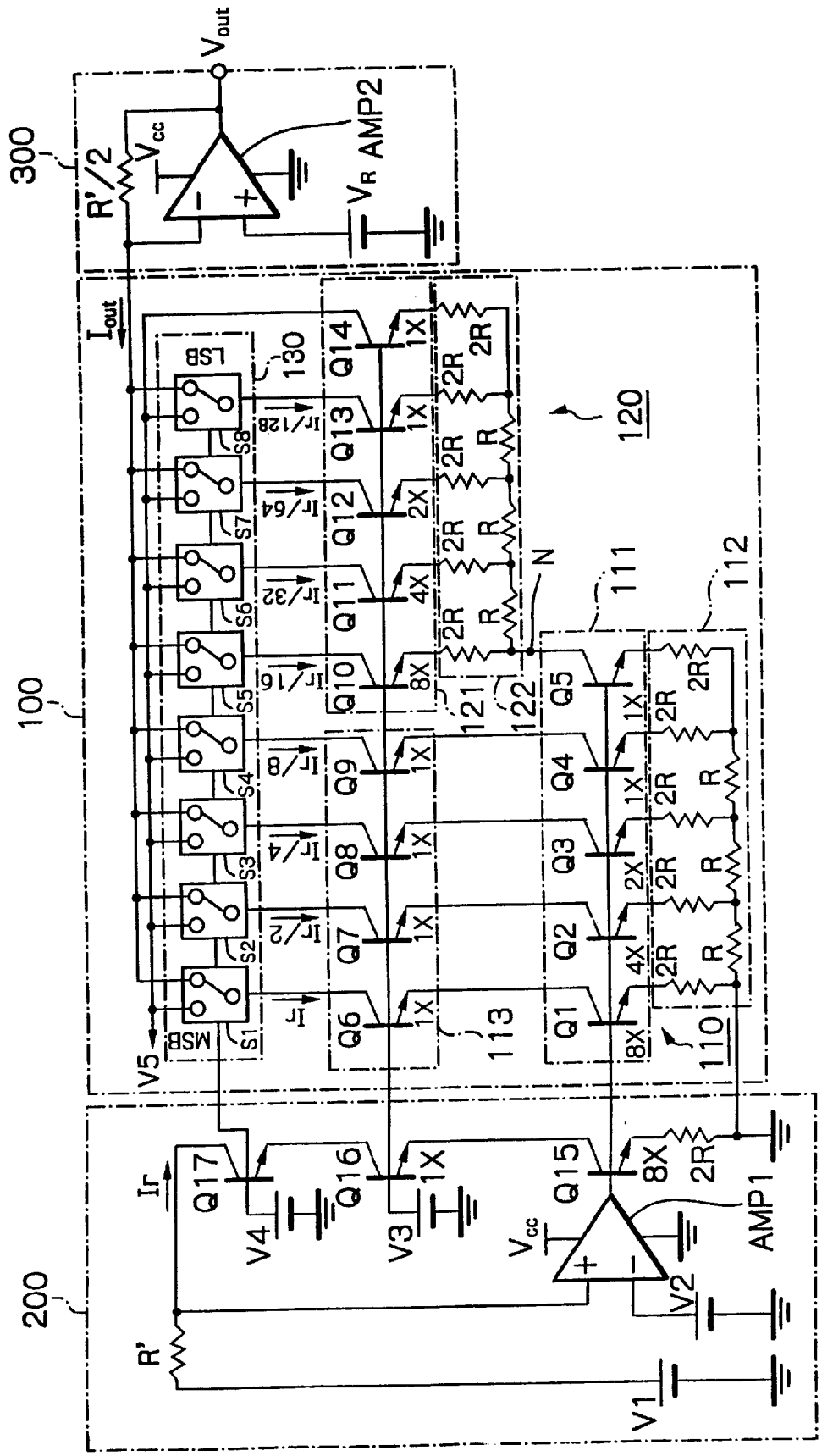
FIG. 1 is a circuit diagram illustrating a prior art D/A converter.

In FIG. 1, which illustrates a prior art 8-bit D/A converter, the D/A converter is constructed by a D/A converting section 100, a reference voltage generating circuit 200, and a current-to-voltage converting section 300.

The D/A converting section 100 is constructed by a master ladder circuit 110, a slave ladder circuit 120 and a current switch circuit 130.

In more detail, the master ladder circuit 110 is formed by a constant current transistor circuit 111 including bipolar transistors Q1, Q2, Q3, Q4 and Q5 having emitter areas 8X, 4X, 2X, 1X and 1X, respectively, an R-2R resistance ladder circuit 112 connected to the emitters of the bipolar transistors Q1, Q2, Q3, Q4 and Q5, and a current compensating circuit 113 including bipolar transistors Q6, Q7, Q8 and Q9 having an emitter area 1X connected to the collectors of the bipolar transistors Q1, Q2, Q3 and Q4, respectively.

Similarly, the slave ladder circuit 120 is formed by a constant current transistor circuit 121 including bipolar transistors Q10, Q11, Q12, Q13 and Q14 having emitter areas 8X, 4X, 2X, 1X and 1X, respectively, and an R-2R resistance ladder circuit 122 connected to the emitters of the bipolar transistors Q10, Q11, Q12, Q13 and Q14.

The current switch circuit 130 is formed by bipolar current switches S1, S2, ..., S8 connected to the collectors of the transistors Q6, Q7, ..., Q13, respectively.

The reference voltage generating circuit 200 is constructed by four reference voltage sources V1, V2, V3 and V4, a resistor R' connected to the reference voltage source V1 for converting a current flowing therethrough into a voltage, bipolar transistors Q15, Q16 and Q17 connected in series between the resistor R' and the ground terminal, emitter resistor 2R connected to the emitter of the transistor Q15, and an operational amplifier AMP1 for controlling the base voltage of the transistors Q15. In this case, the operational amplifier AMP1 has a positive input terminal connected to the resistor R' and a negative input terminal connected to the reference voltage source V2.

The current-to-voltage converting section 300 is formed by an operational amplifier AMP2 having a positive input terminal connected to a reference voltage source $V_R$ and a negative input terminal connected to the current switches S1, S2, ..., S8, and a feedback resistor R'/2 connected between the output terminal and the negative input terminal of the operational amplifier AMP2. As a result, the current-to-voltage converting section 300 converts a total current $I_{out}$ flowing through the current switches S1, S2, ..., S8 into an output voltage $V_{out}$.

The bases of the transistors Q1, Q2, Q3, Q4 and Q5 as well as the base of the transistor Q15 are connected to the output of the operational amplifier AMP1, so that the voltages at the bases of the transistors Q1, Q2, Q3, Q4, Q5 and Q15 are controlled at V2. Also, the bases of the transistors Q6, Q7, Q8, Q9, Q10, Q11, Q12, Q13 and Q14 as well as the base of the transistor Q16 are controlled at V3.

Figure 2A:
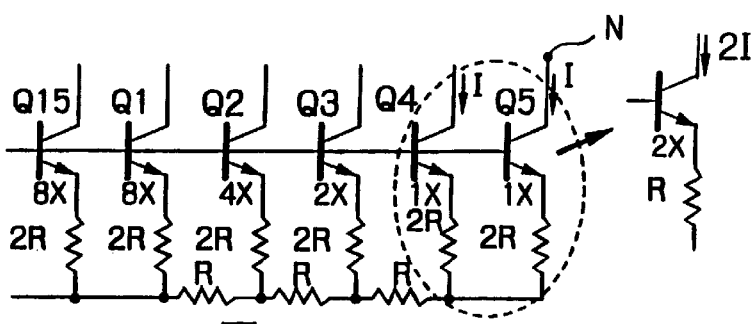
FIGS. 2A, 2B, 2C, 2D and 2E are circuit diagrams for explaining the binary circuits flowing through the master ladder circuit of FIG. 1.
Figure 2B:
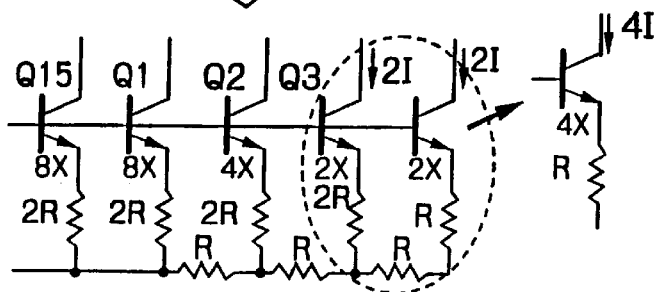
Figure 2C:
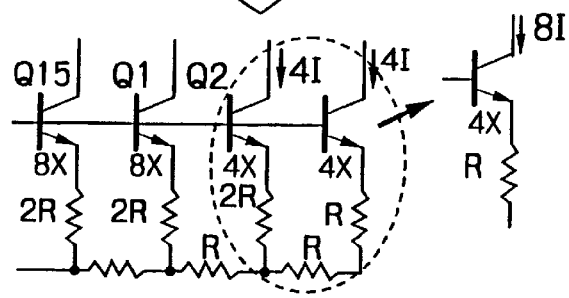
Figure 2D:
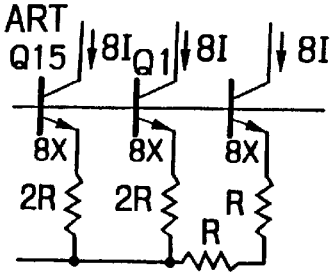
Figure 2E:
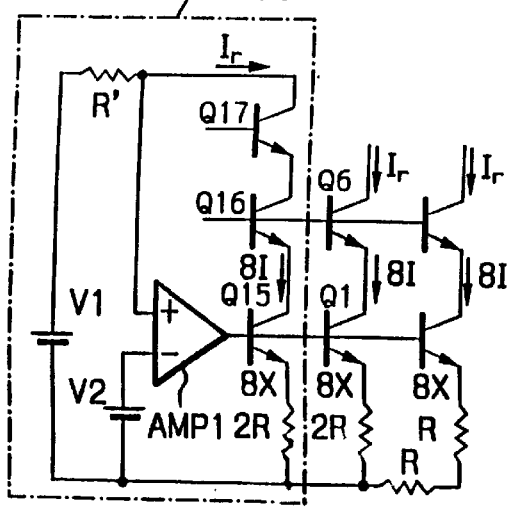
Figure 3A:
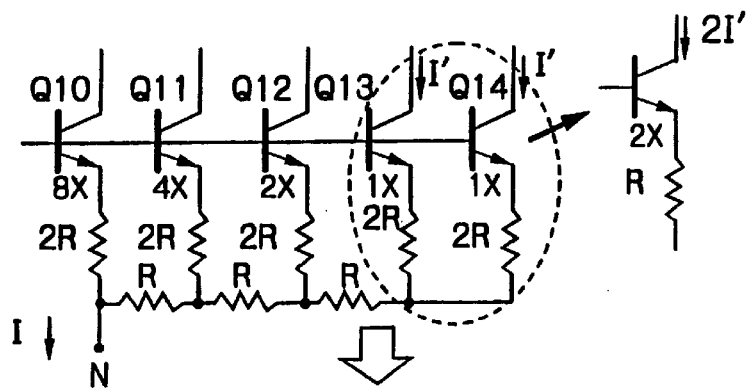
FIGS. 3A, 3B, 3C and 3D are circuit diagrams for explaining the binary currents flowing through the slave ladder circuit of FIG. 1.
Figure 3B:
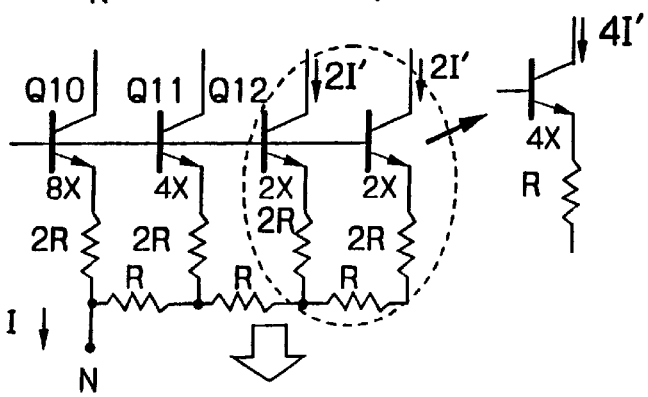
Figure 3C:
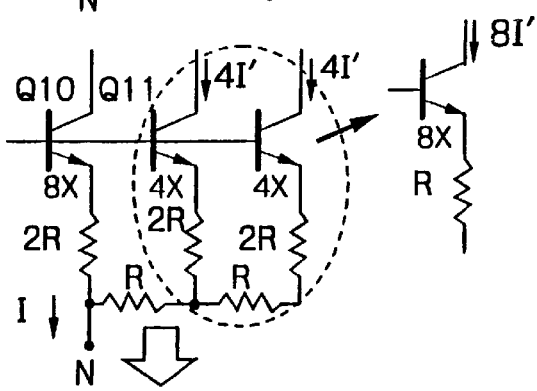
Figure 3D:
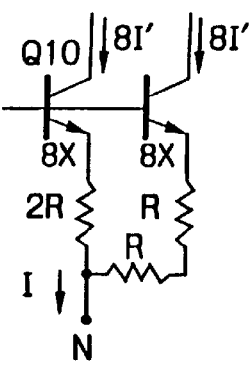

The four upper bits are subject to a D/A conversion by the master ladder circuit 110 through which binary cirremts flow as illustrated in FIGS. 2A, 2B, 2C, 2D and 2E. In FIG. 2E, a reference current $I_r$ is approximately determined by (V2−V1)/R'. In this case, a current I flowing through the node N between the constant current transistor circuit 111 and the R-2R resistance ladder circuit 122 is represented by I=$I_r$/8.

The four lower bits are subject to a D/A conversion by the slave ladder circuit 120 through which binary currents flow as illustrted in FIGS. 3A, 3B, 3C and 3D. In this case, a current I' flowing through the transistor Q14 is represented by I'=I/16=$I_r$/128.

Figure 4:
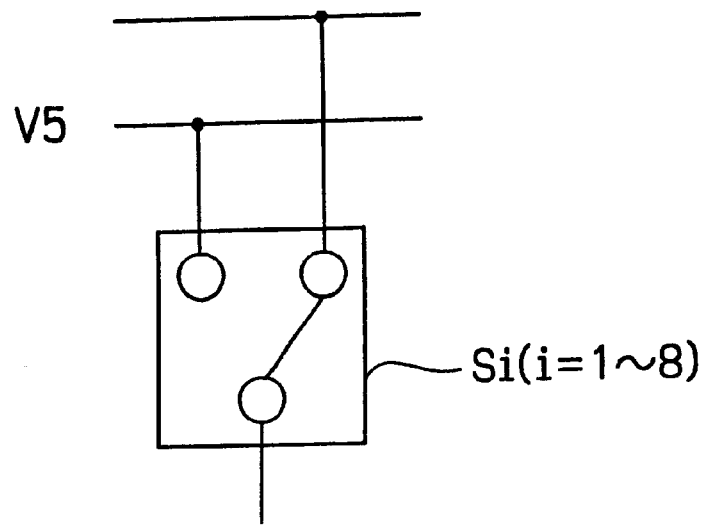
FIG. 4 is a circuit diagram of the current switch of FIG. 1.
Figure 4:
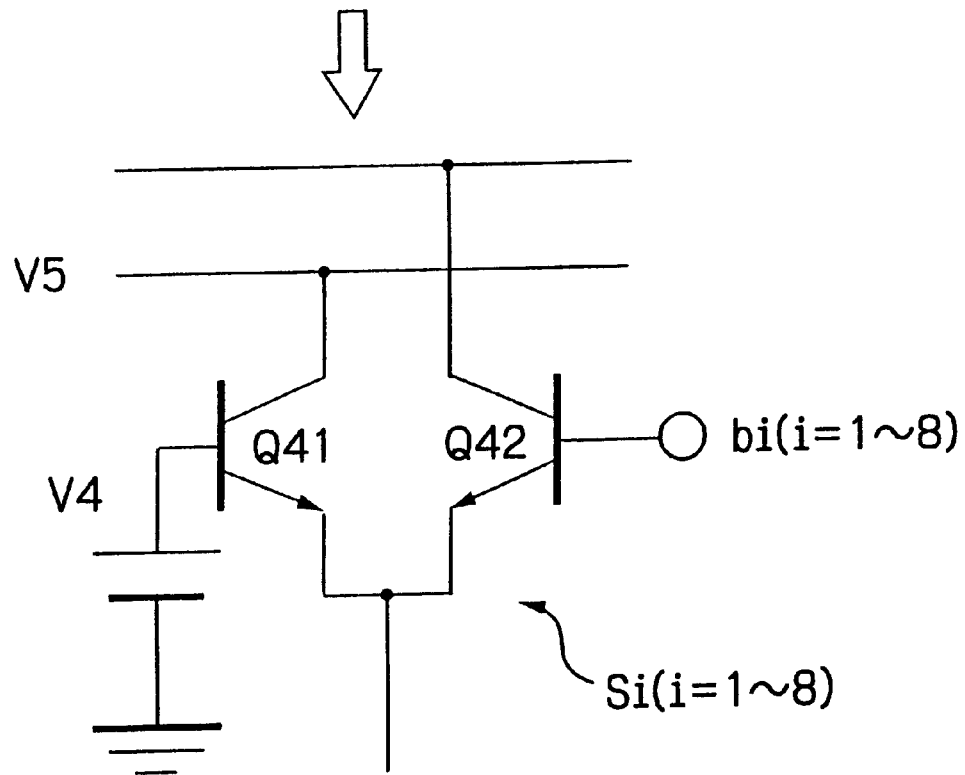
Figure 5:
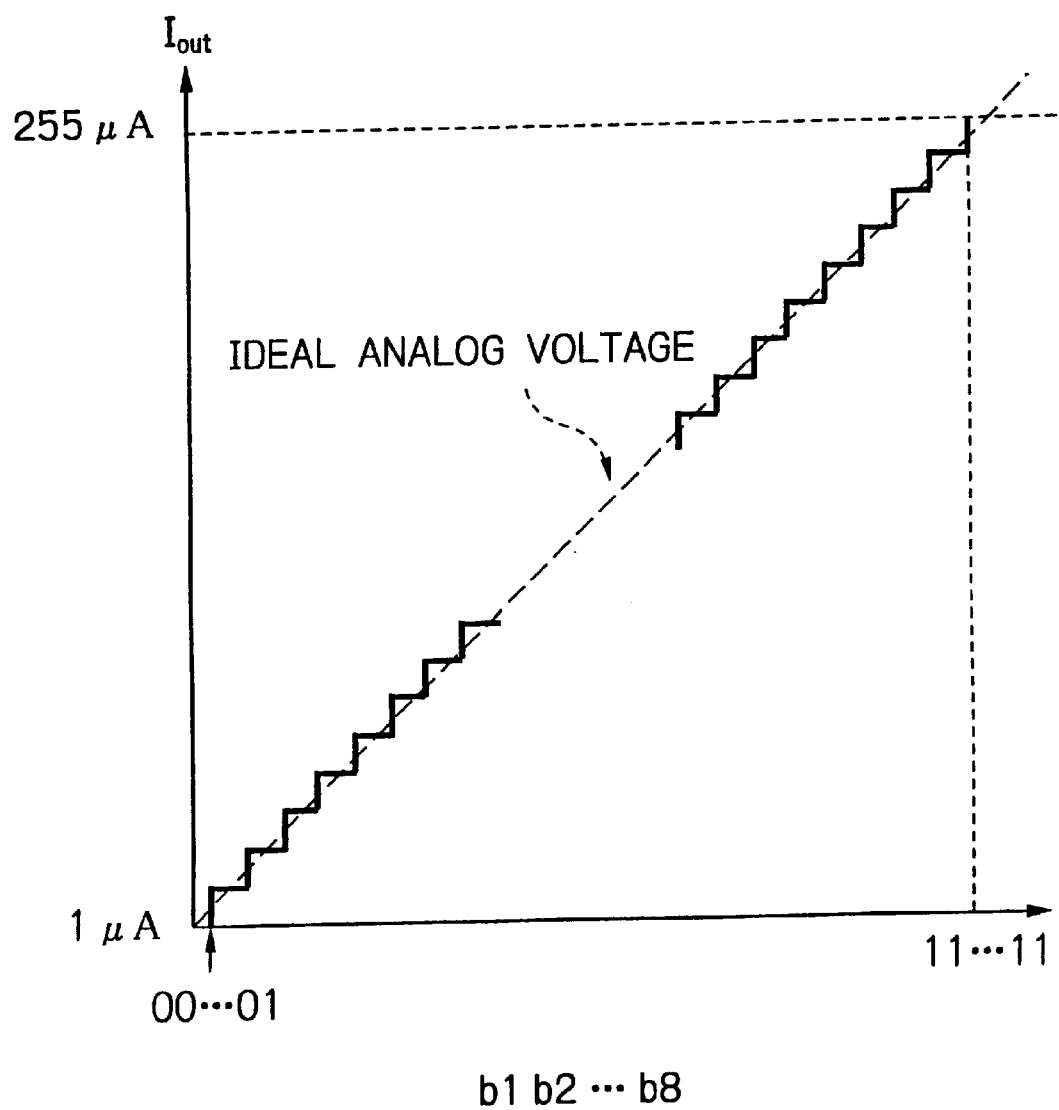
FIG. 5 is a graph showing the analog output current characteristics of the D/A converter of FIG. 1.

Returning to FIG. 1, the base of the transistor Q17 is controlled at V4 which is also supplied to the current switches S1, S2, ..., S8. Each of the current switches S1, S2, ..., S8 is illustrated in FIG. 4. That is, the current switch Si is formed by bipolar transistors Q41 and Q42 having a common emitter. In this case, the base and collector of the transistor Q41 are controlled at V4 and V5, respectively, and the base of the transistor Q42 receives a binary data signal bi. As a result, if the binary data signal bi is "0" (low), the transistor Q41 and Q42 are turned ON and OFF, respectively. On the other hand, if the binary data signal bi is "1" (high), the transistor Q41 and Q42 are turned OFF and ON, respectively.

The operation of the D/A converter of FIG. 1 is explained below.

In the master ladder circuit 110, the collector currents $I_C(Q1)$, $I_C(Q2)$, $I_C(Q3)$, $I_C(Q4)$, and $I_C(Q5)$ are represented by $$I_C(Q1):I_C(Q2):I_C(Q3):I_C(Q4):I_C(Q5)=1:\tfrac{1}{2}:\tfrac{1}{4}:\tfrac{1}{8}:\tfrac{1}{8} \quad (1)$$

In the slave ladder circuit 120, the collector currents $I_C(Q10)$, $I_C(Q11)$, $I_C(Q12)$, and $I_C(Q13)$ are represented by $$I_C(Q10):I_C(Q11):I_C(Q12):I_C(Q13)=1:\tfrac{1}{2}:\tfrac{1}{4}:\tfrac{1}{8} \quad (2)$$

In this case, $$I_C(Q5)=I_C(Q10)+I_C(Q11)+I_C(Q12)+I_C(Q13)+I_C(Q14) \quad (3)$$

Therefore, from the equations (1), (2) and (3), $$I_C(Q1):I_C(Q2):I_C(Q3):I_C(Q4):I_C(Q10):I_C(Q11):I_C(Q12):I_C(Q13)= \\ 1:\tfrac{1}{2}:\tfrac{1}{4}:\tfrac{1}{8}:\tfrac{1}{16}:\tfrac{1}{32}:\tfrac{1}{64}:\tfrac{1}{128} \quad (4)$$

Thus, an analog output current $I_{out}$ is represented by $$I_{out}=I_r \cdot 2(b_1 2^{-1}+b_2 2^{-2}+b_3 2^{-3}+b_4 2^{-4}+b_5 2^{-5}+b_6 2^{-6}+b_7 2^{-7}+b_8 2^{-8}) \quad (5)$$

where $I_r=(V_1-V_2)/R'$.

The analog output current $I_{out}$ is converted by the current-to-voltage converting section 300 into an analog output voltage $V_{out}$ represented by $$V_{out}=V_R-I_{out} \cdot R'/2=V_R-(V_1-V_2)(b_1 2^{-1}+b_2 2^{-2}+b_3 2^{-3}+b_4 2^{-4}+b_5 2^{-5}+b_6 2^{-6}+b_7 2^{-7}+b_8 2^{-8}) \quad (6)$$

In the D/A converter of FIG. 1, however, since the current switches S1, S2, ..., S8 use bipolar transistors Q41 and Q42, a collector current $I_C$ flowing through the transistor Q42, which contributes to the analog output current $I_{out}$, is smaller than an emitter current IE flowing through the transistor Q42. That is, $$I_C=I_E \cdot h_{FE}/(1+h_{FE}).$$

where $h_{FE}$ is an emitter ground current amplification factor. Therefore, in order to compensate for the error caused by the emitter ground current amplification factor $h_{FE}$, the transistor Q17 and the reference voltage source V4 are provided in the reference voltage generating circuit 200, which complexes the D/A converter of FIG. 1, thus increasing the manufacturing cost. Additionally, in order to operate the transistors Q41 and Q42 in a non-saturated state, a control circuit for adjusting the binary data signal bi (i=1~8) is required, which also makes the D/A converter of FIG. 1 more complex. Thus, the manufacturing cost is further increased.

Also, in the D/A converter of FIG. 1, since the analog output current $I_{out}$ of the D/A converting section 100 is directly supplied to the current-to-voltage converting section 300, the dynamic range of the analog output voltage $V_{out}$ is, from $V_R$ to $V_{CC}$. For example, if $V_R$ is 5V and $V_{CC}$ is 6.5V, the dynamic range of the analog output voltage $V_{out}$ is 5V to 6.5V, which is very narrow.

Further, in the D/A converter of FIG. 1, the transistors Q15, Q16 and Q17 are connected in series in the reference voltage generating circuit 200, the following condition is required:

V1>V2≧V4

This is disadvantageous in terms of lowering the power supply voltage of the D/A converter.

Figure 6:
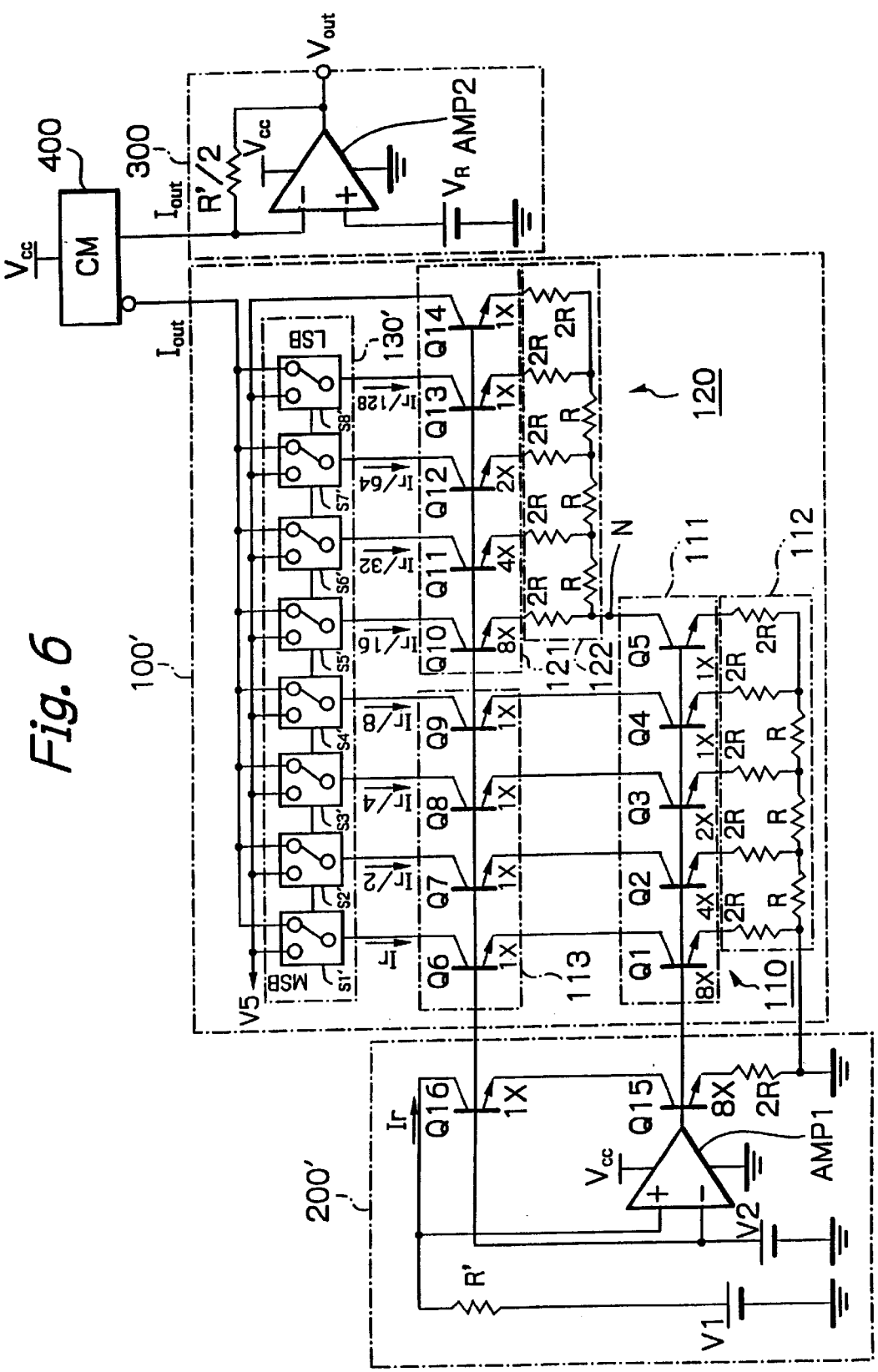
FIG. 6 is a circuit diagram illustrating an embodiment of the D/A converter according to the present invention.

In FIG. 6, which illustrates an embodiment of the present invention, the D/A converting section 100 of FIG. 1 is replaced by a D/A converting section 100' including a current switch circuit 130' formed by MOS transistor current switches S1', S2', . . . , S8'. Also, the reference voltage generating circuit 200 of FIG. 1 is replaced by a reference voltage generating circuit 200' where the reference voltage source V2 is connected to the base of the transistor Q16, and the transistor Q17 and the reference voltage source V4 are not provided.

Also, a current mirror circuit 400 is provided between the D/A converting section 100' and the current-to-voltage converting section 300.

Even in the D/A converter of FIG. 6, the analog output current $I_{out}$ is represented by the above-mentioned equation (5), and the analog output voltage $V_{out}$ is represented by the above-mentioned equation (6).

Figure 7:
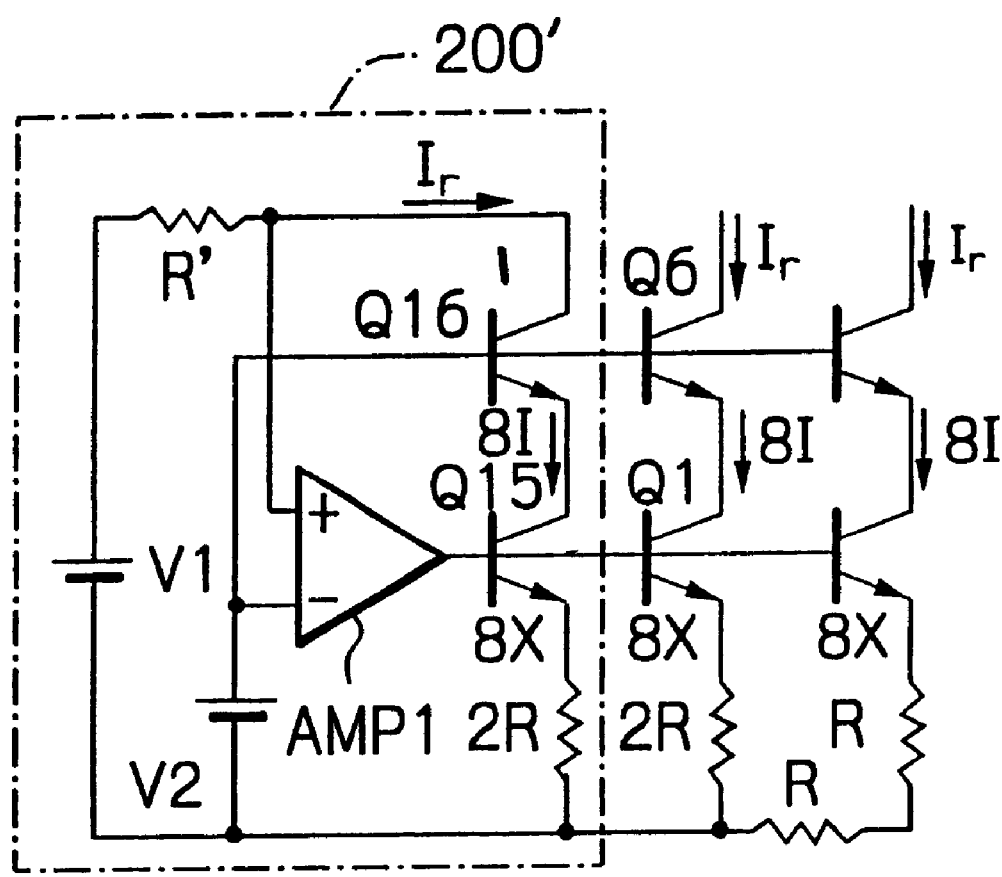
FIG. 7 is a circuit diagram for explaining the binary currents flowing through the master ladder circuit of FIG. 6.

In the D/A converter of FIG. 6, the equivalent circuit of FIG. 2E is replaced by an equivalent circuit as illustrated in FIG. 7. Therefore, if the emitter ground current amplification factor $h_{FE}$ of the transistors Q15 and Q16 is the same as those of the transistors Q1 and Q6, the analog output current $I_{out}$ is accurately dependent on $I_r$, i.e., (V1−V2)/R' independently of the emitter ground current amplification factor $h_{FE}$.

Figure 8:
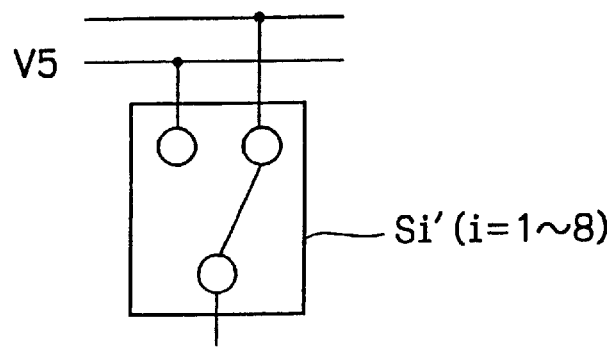
FIG. 8 is a circuit diagram of the current switch of FIG. 6.
Figure 8:
Figure 8:
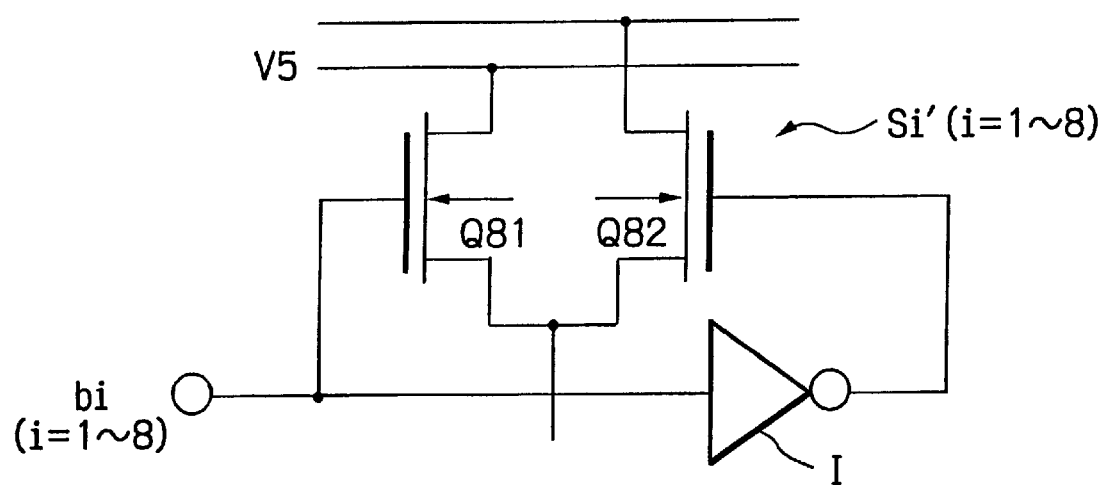

Each of the current switches S1', S2', . . . , S8' is illustrated in FIG. 8. That is, the current switch Si' is formed by two N-channel MOS transistors Q81 and Q82 having a common source and an inverter I. The transistor Q81 has a drain controlled at V5 and a gate controlled by the binary data signal bi, and the transistor Q82 has a drain for supplying the analog output current $I_{OUT}$ and a base controlled by the inverted signal of the binary data signal bi through the inverter I. Generally, since a source current of a MOS transistor is approximately the same as a drain current thereof, the current flowing therethrough does not involve the problem that a collector current of a bipolar transistor depends upon the emitter ground current amplification factor $h_{FE}$ thereof.

Figure 9:
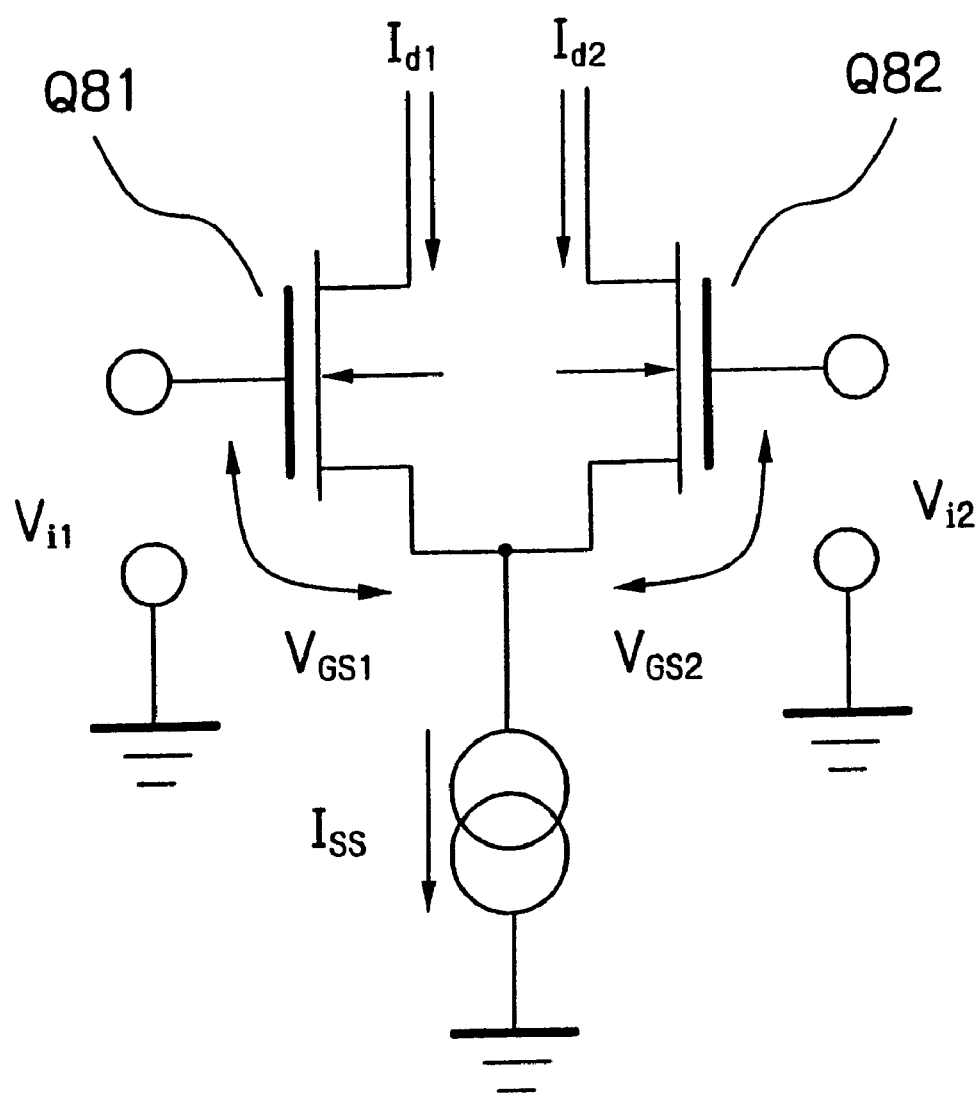
FIG. 9 is a circuit diagram for explaining the operation of the current switch of FIG. 8.

The input/output characteristics of the current switch Si of FIG. 8 is explained next with reference to FIG. 9.

Generally, if a MOS transistor is operated in a five-electrode tube and the back gate effect is negligible, a drain current $I_d$ of the MOS transistor is represented by $$I_d = \beta(V_{GS} - V_{th})^2 \quad (7)$$

where $\beta = \mu_n C_0 W/2L$;

$\mu_n$ is the mobility of electrons;

$C_0$ is a MOS capacitance per unit area of a MOS insulating layer;

W is a gate width;

L is a gate length;

$V_{GS}$ is a gate-to-source voltage; and $V_{th}$ is a threshold voltage. Therefore, in FIG. 9, $$I_{d1} = \beta(V_{GS1} - V_{th})^2 \quad (8)$$

$$I_{d2} = \beta(V_{GS2} - V_{th})^2 \quad (9)$$

$$I_{d1} + I_{d2} = I_{SS} \quad (10)$$

$$V_{i1} - V_{GS1} + V_{GS2} - V_{i2} = 0 \quad (11)$$

From the equations (8) and (9), $$V_{GS1} = \sqrt{I_{d1}/\beta} + V_{th} \quad (12)$$

$$V_{GS2} = \sqrt{I_{d2}/\beta} + V_{th} \quad (13)$$

Therefore, $$\Delta V = V_{i1} - V_{i2} \quad (14)$$
$$= V_{GS1} - V_{GS2}$$
$$= \left(\sqrt{I_{d1}} - \sqrt{I_{d2}}\right)/\sqrt{\beta}$$

From the equations (10) and (14), $$\Delta V = (\sqrt{I_{d1}} - \sqrt{I_{SS} - I_{d1}})/\sqrt{\beta} \quad (15)$$

$$\therefore I_{d1} = (I_{SS}/2)\cdot(1 + \Delta V \cdot \beta(\sqrt{2/I_{SS}\beta) - (\Delta V/I_{SS})^2}) \quad (16)$$

Similarly, $$I_{d2} = (I_{SS}/2)\cdot(1 - \Delta V \cdot \beta\sqrt{(2/I_{SS}\beta) - (\Delta V/I_{SS})^2}) \quad (17)$$

For example, if $\epsilon_{OX} = 3.83 \times 8.842 \times 10^{-14}$ F/cm;

$T_{OX} = 1.6 \times 10^{-16}$ cm(Typ);

$\mu_n = 3.8058557 \times 10^2$ cm²/V·sec;

$V_{th} = 0.7$V(Typ.);

L = 0.56 μm; and

Figure 10A:
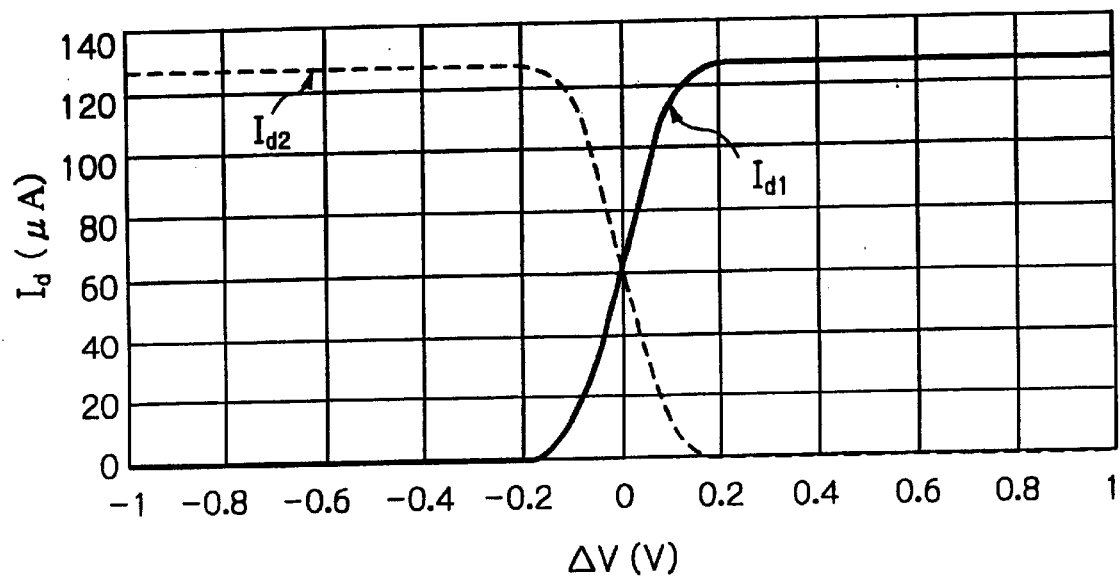
FIGS. 10A and 10B are diagrams for showing the drain current characteristics of the circuit of FIG. 9.
Figure 10B:
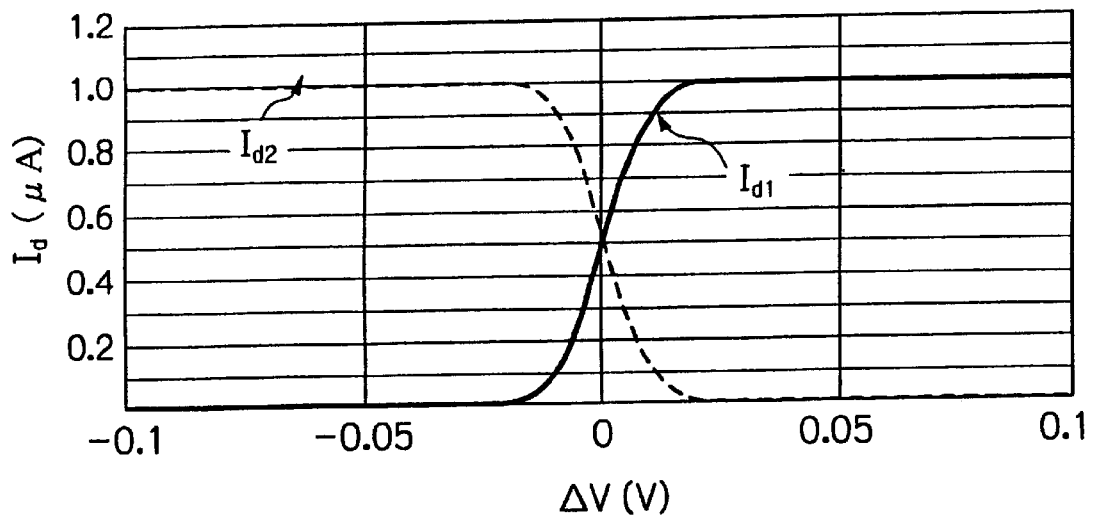

W = 5 μm, then, $\beta = \mu_n C_0 W/2L = \mu_n \epsilon_{OX} W/2T_{OX} L = 3.596 \times 10^{-13}$ The drain current characteristics of the equations (16) and (17) are shown in FIGS. 10A and 10B, where $I_{SS} = 128$ μA and $I_{SS} = 1$ μA, respectively. That is, if the input voltage difference $\Delta V$ is about 0.2V for $I_{SS} = 128$ μA, the state of the current switch can be easily switched. Similarly, if the input voltage difference $\Delta V$ is about 0.02V for $I_{SS} = 1$ μA, the state of the current switch can be easily switched.

Figure 11:
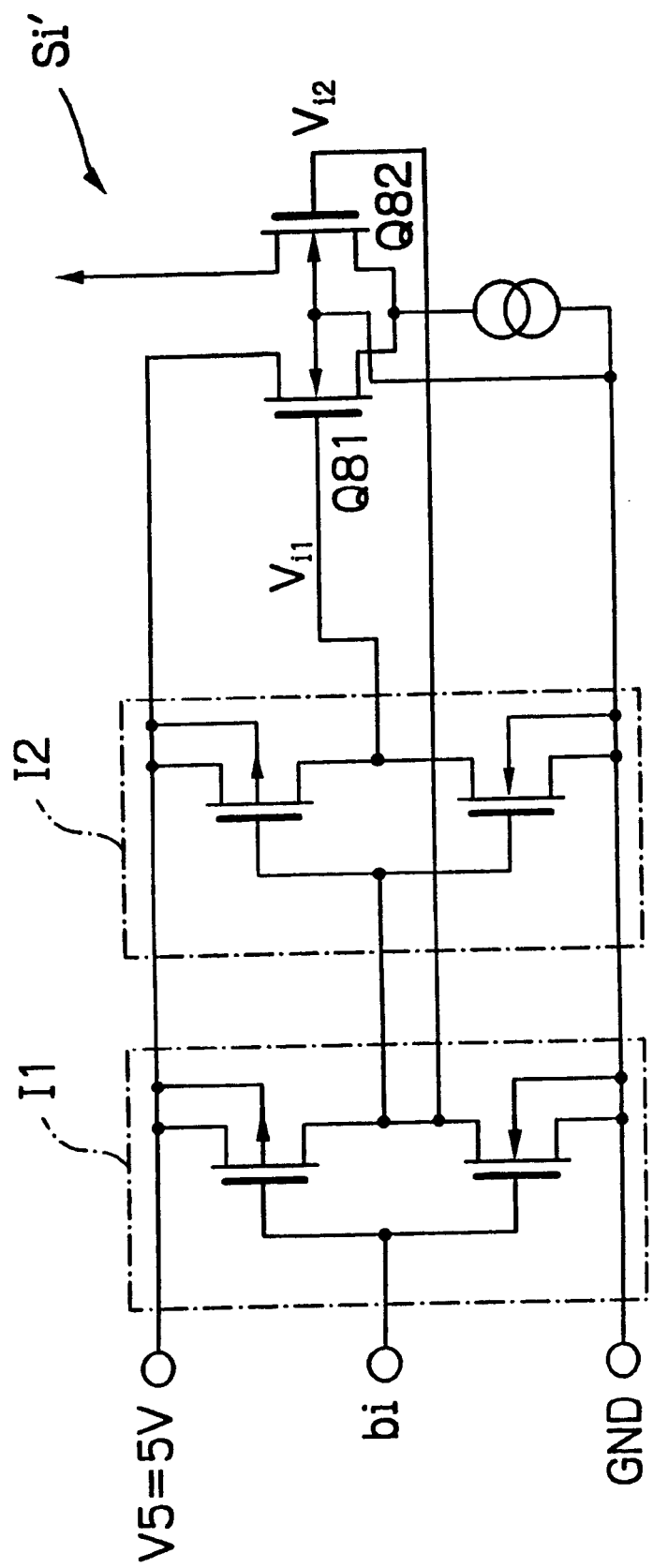
FIG. 11 is an actual circuit diagram of the current switch of FIG. 8.

The current switch Si' of FIG. 8 is constructed by two CMOS inverters I1 and I2 as illustrated in FIG. 11. In FIG. 11, the inverter I1 corresponds to the inverter I of FIG. 8, and the inverter I2 is added to apply a non-inverted binary data signal bi. Therefore, the input voltages $V_{i1}$ and $V_{i2}$ are changed from 0V to 5V, so that the state of the current switch Si' can be easily switched.

Figure 12:
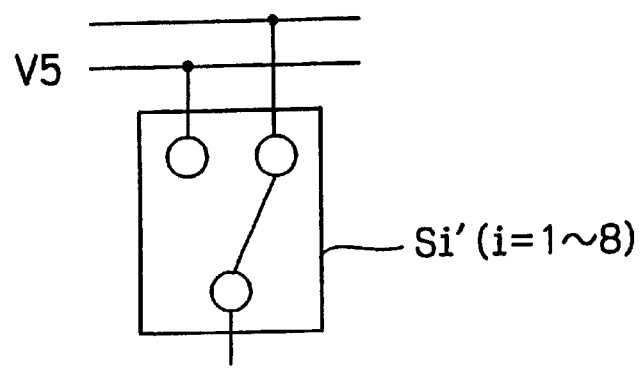
FIG. 12 is a circuit diagram illustrating a modification of the current switch of FIG. 8.
Figure 12:
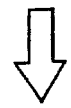
Figure 12:
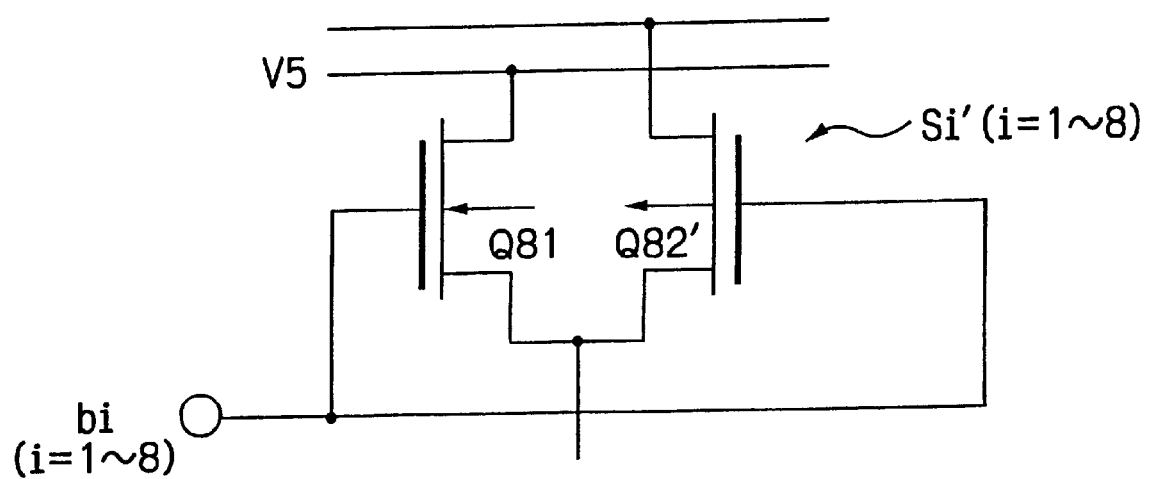
Figure 13:
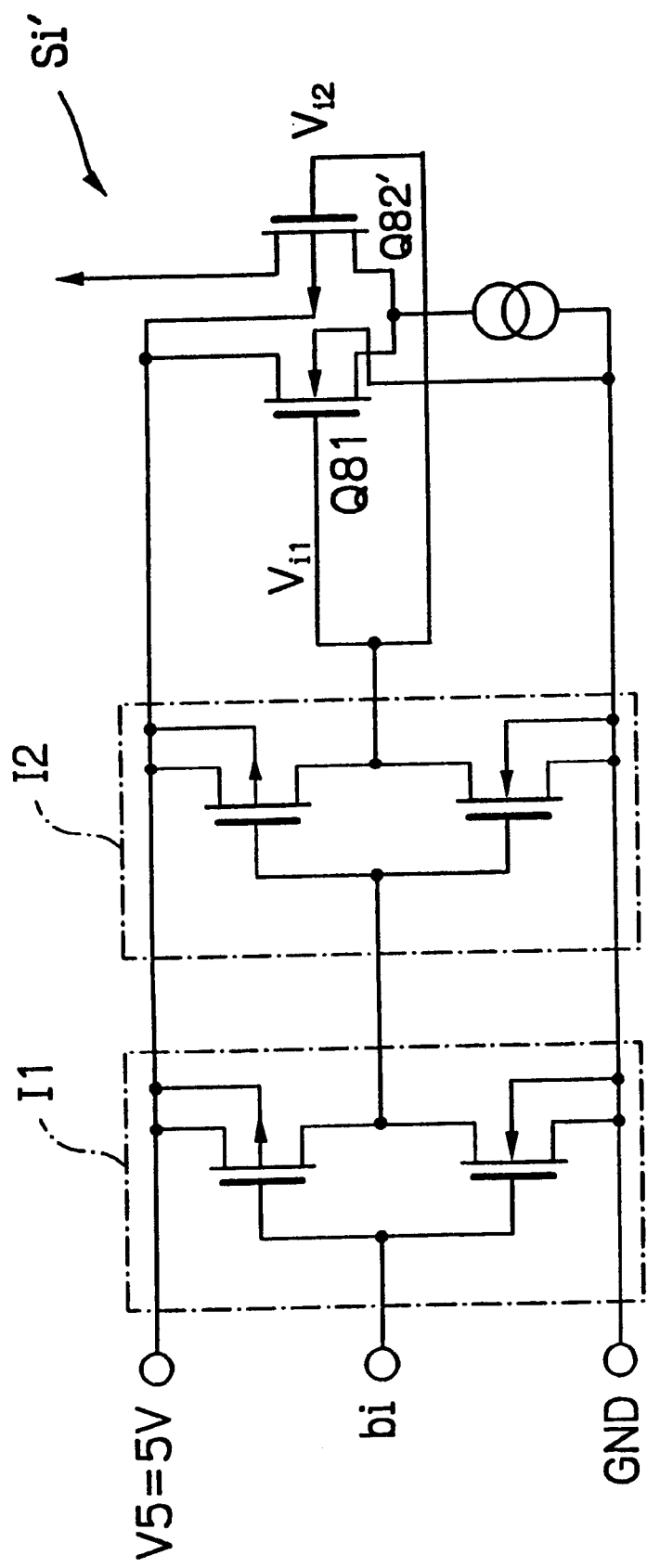
FIG. 13 is an actual circuit diagram of the current switch of FIG. 8.

In FIG. 12, which illustrates a modification of the current switch Si' of FIG. 8, a P-channel MOS transistor Q82' is provided instead of the N-channel MOS transistor Q82 of FIG. 8. As a result, the binary data signal bi is logically applied directly to the gate of the transistor Q82'. In this case, however, in order to increase the amplitude of the input voltage $V_{i1}$ and $V_{i2}$, as illustrated in FIG. 13, the CMOS inverters I1 and I2 are also provided in the same way as in FIG. 11, so that the same input voltage $V_{i1}(=V_{i2})$ is applied to the gates of the transistors Q81 and Q82'.

Figure 14:
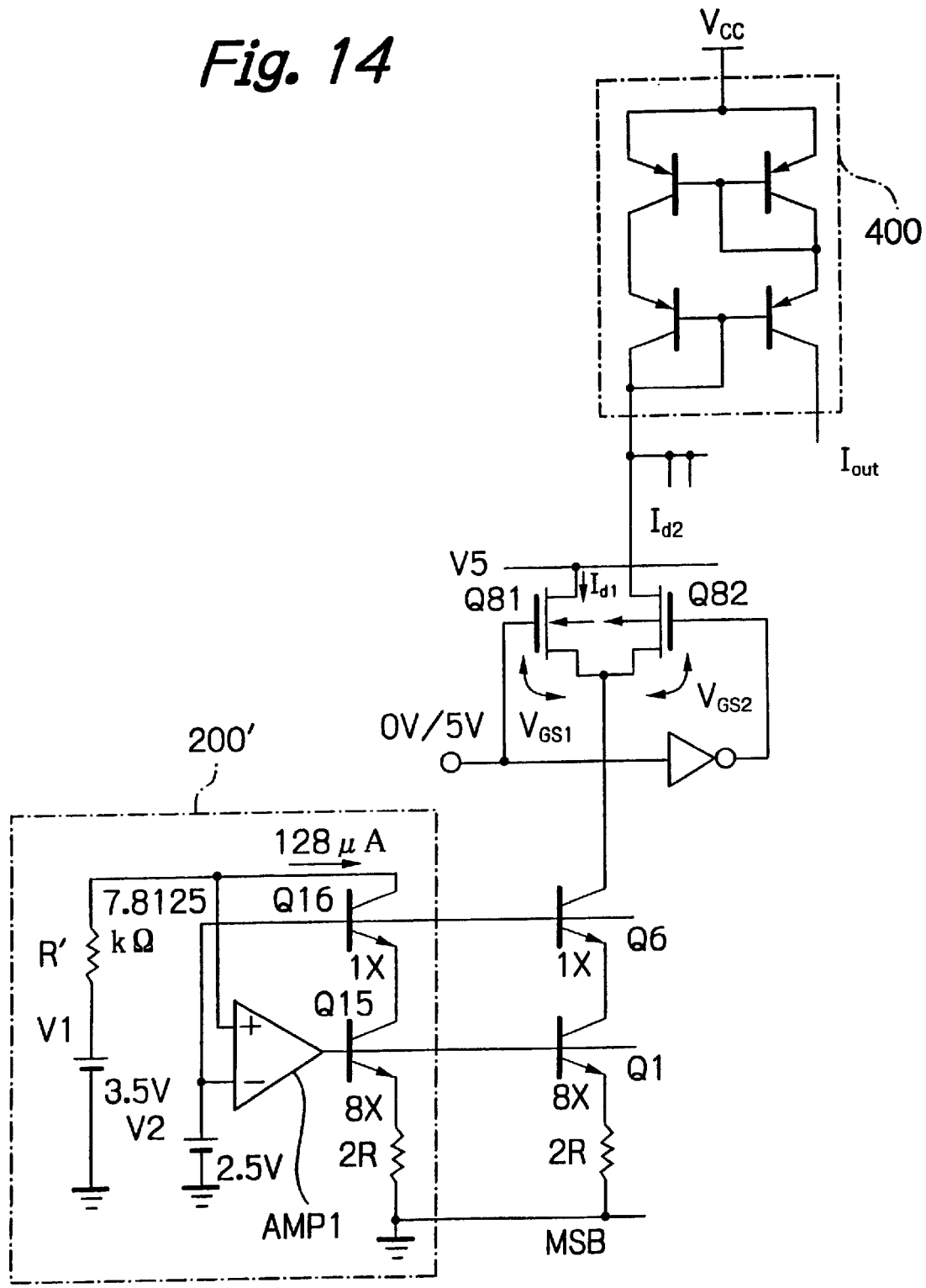
FIG. 14 is a partial circuit diagram of the D/A converter of FIG. 6.

The relationship between the reference voltage source V2 and the operation of the transistor Q6 is explained next with reference to FIG. 14 which is a partial circuit diagram of the circuit of FIG. 6 regarding the most significant bit MSB portion thereof.

In order to determine the value of the reference voltage source V2, the transistors Q15, Q1, Q16 and Q6 have to be operated in a non-saturated region, which limits the base voltage of the transistors Q15 and Q1, the gate-to-source voltages of the transistors Q81 and 82 and their gate control voltages such as 0V and 5V.

First, the base voltages $V_B$ (Q15) and $V_B$ (Q1) of the transistors Q15 and Q1 are represented by $$V_B(Q15)=V_B(Q1)$$

$$V_{BE}(Q15)+128\,\mu A \cdot 2R \tag{18}$$

where $V_{BE}$ (Q15) is a base-to-emitter voltage of the transistor Q15. For example, if R=2.5 kΩ and $V_{BE}$ (Q15)=0.8V, then, $$V_{BE}(Q15)=1.44V$$

Therefore, in order to operate the transistor Q15 in a non-saturated region, $$V_C\,(Q15) \geq V_{BE}\,(Q15)$$

where $V_C$ (Q15) is a collector voltage of the transistor Q15. Thus, $$V2 \geq V_C\,(Q15) + V_{BE}\,(Q16)$$
$$= 1.44 + .08$$
$$= 2.24\ V$$

As a result, if the value of the reference voltage source V2 can be 2.5V, the collector voltage and base voltage of the transistor Q16 are also 2.5V due to the imaginary shortage between the inputs of the operational amplifier AMP1. Thus, the transistor Q16 is operated in a non-saturated region.

Next, the non-saturated operation of the transistor Q6 is explained below.

The gate-to-source voltages $V_{GS1}$, and $V_{GS2}$ of the transistors Q81 and Q82 are represented using the equations (12) and (13) in view of the back gate voltage $V_B$ by $$V_{GS1}=\sqrt{I_{d1/\beta}}+(V_{th}+\gamma\sqrt{V_B}) \tag{19}$$

$$V_{GS2}=\sqrt{I_{d2/\beta}}+(V_{th}+\gamma\sqrt{V_B}) \tag{20}$$

In order to operate the transistor Q6 in a non-saturated region, the base voltage of the transistor Q6 is not higher than the collector voltage of the transistor Q6. That is, $$V2 \leq 5V-V_{GS1}$$

$$\therefore 2.5V \leq 5V-(\sqrt{I_{d2/\beta}}+V_{th}+\gamma\sqrt{V_B})) \tag{21}$$

For example, if
$\epsilon_{OX}=3.83\times8.842\times10^{-14}$/cm;
$T_{OX}=1.7\times10^{-6}$ cm>1.6×10⁶ cm(Typ.);
$\mu_n=3.8058557\times10^2$ cm²cm/V·sec;
$V_{th}=0.85V>0.7V$ (Typ.);
L=0.56 μm;
W=5 μm;
$V_B$ =3V;
γ=0.5; and
$I_{d2}$=128 μA(MSB), then, the left term of the formula (21) is 3.085V. Note that the thickness $T_{OX}$ of the gate insulating layer and the threshold voltage $V_{th}$ are set at worse conditions, and the drain current $I_{d2}$ is a maximum value, i.e., 128 μA. Thus, the formula (21) is completely satisfied, so that the transistor Q6 can be operated in a non-saturated region.

The dynamic range of the analog output voltage $V_{out}$ is determined by the condition that the MOS transistors Q81 and Q82 are not operated in a non-saturated region (a triode region), i.e., $$V_{DS} \geq V_{GS}-V_{th} \tag{22}$$

where $V_{GS}$ is a drain-to-source voltage; and $V_{GS}$ is a gate-to-source voltage. In this case, if the source voltage of the MOS transistors Q81 and Q82 is at worst about 3V, the threshold voltage $V_{th}$ is at worst 0.55V and the back gate voltage $V_B$ is 3V, then, the formula (22) is $$V_{DS} \geq (5V-3V)-(0.55V+0.87V)=0.58V$$

Therefore, the drain voltage of the transistor Q82 has to be higher than 3V+0.58V (=3.58V). Note that, if the current mirror circuit 400 is powered by $V_{CC}$=6.0V and has a voltage drop of about 1.9V, the output voltage of the current mirror circuit 400 is 6.0–1.9=4.1V. Thus, the above-mentioned drain voltage of the transistor Q82 is satisfied, so that the D/A converter of FIG. 6 can be operated under the condition that the power supply voltage $V_{CC}$ is 6.0V.

Figure 15A:
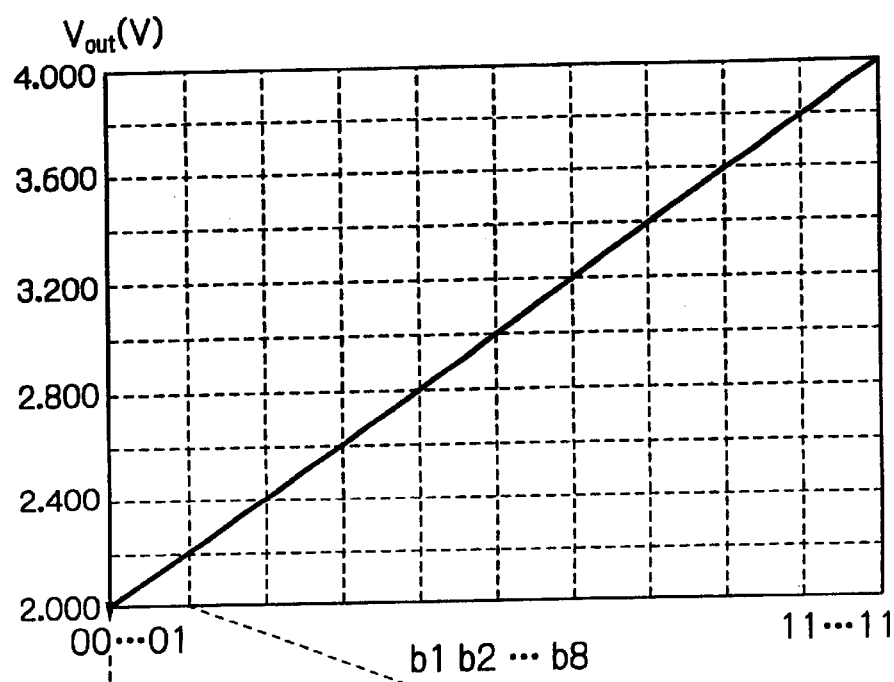
FIG. 15A is a graph showing the analog output voltage characteristics of the D/A converter of FIG. 6.
Figure 15B:
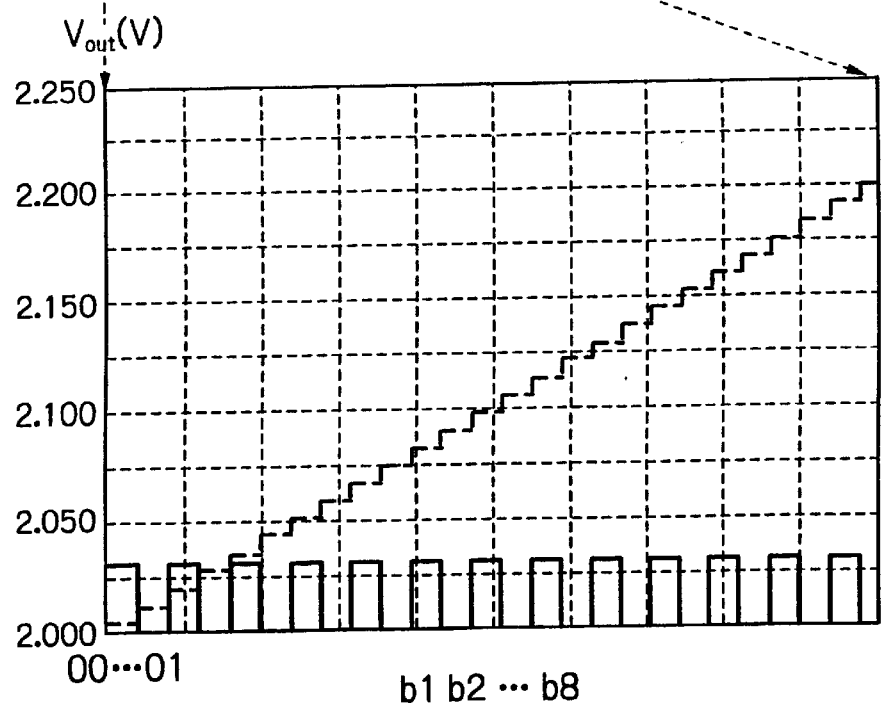
FIG. 15B is a partly-enlarged graph of the graph of FIG. 15A.

The analog output voltage characteristics of the D/A converter of FIG. 6 are obtained by a simulation method using $V_{CC}$=6.0V as shown in FIG. 15A and FIG. 15B which is a partly-enlarged graph of the graph of FIG. 15A. As shown in FIGS. 15A and 15B, linearity characteristics of the analog output voltage $V_{out}$ are excellent and a dynamic output voltage range of 2V can be obtained.

Figure 16:
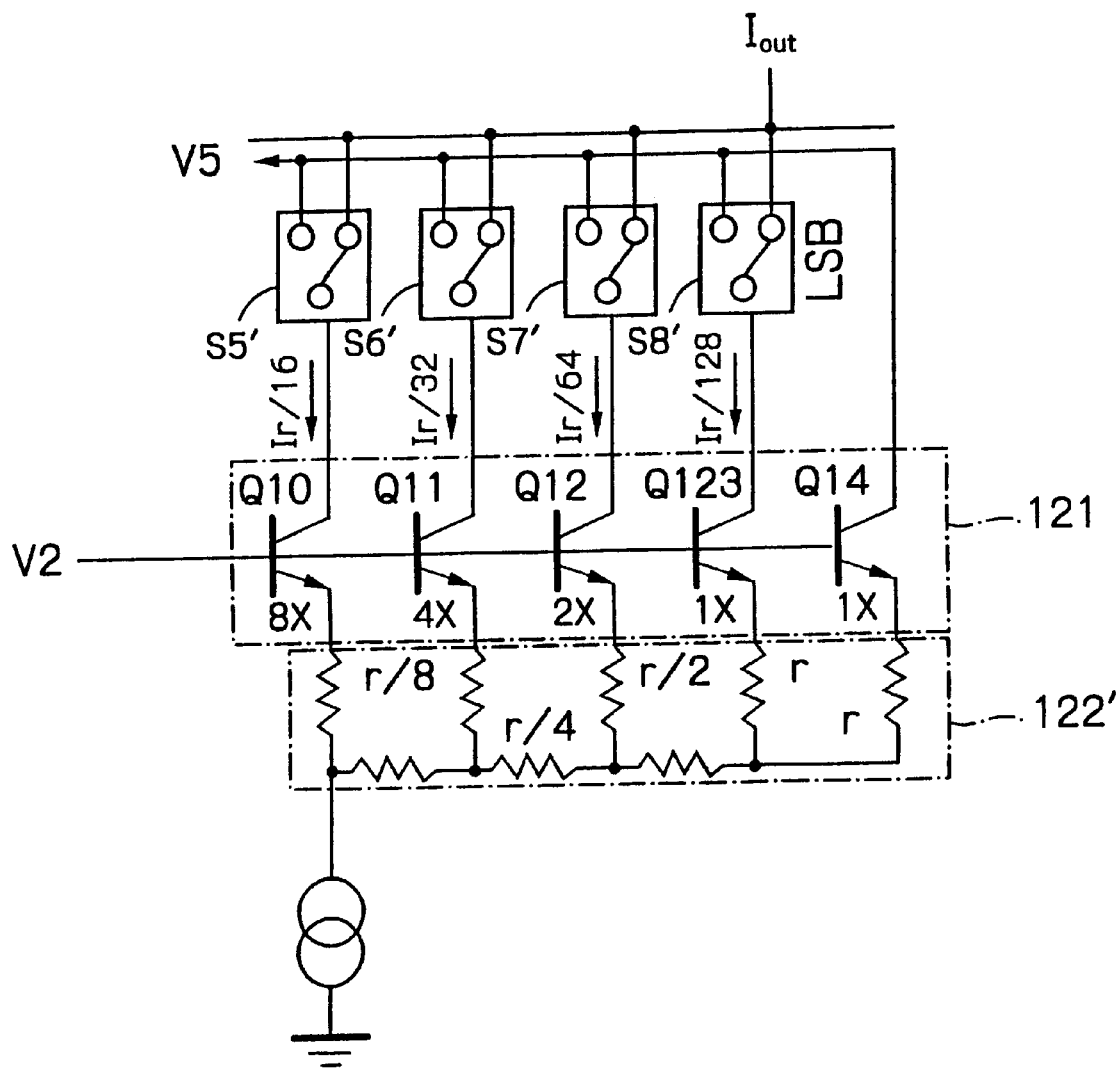
FIG. 16 is a circuit diagram illustrating a modification of the slave ladder circuit of FIG. 6.

In the above-mentioned embodiment, the R-2R resistance ladder circuit 112 or 122 of FIG. 6 can be replaced by a weighted resistance circuit. For example, as illustrated in FIG. 16, the R-2R resistance ladder circuit 122 of FIG. 6 is replaced by a weighted resistance circuit 122'. For example, the collector currents $I_C$(Q10) and $I_C$(Q11) of the transistors Q10 and Q11 satisfy the following:

$$kT/q\ \ln(I_C(Q10)/8I_C)+I_C(Q10)\cdot r/8=kT/q1n(I_C(Q11)/4I_C)+I_C(Q11)\cdot r/4$$

where k is the Boltzmann constant;
T is an absolute temperature; and
q is an electron charge. Therefore,
$I_C$(Q10)=2$I_C$(Q11)
Similarly,
$I_C$(Q11)=2$I_C$(Q12)
$I_C$(Q12)=2$I_C$(Q13)
Thus, the equation (2) is also satisfied.

Figure 17:
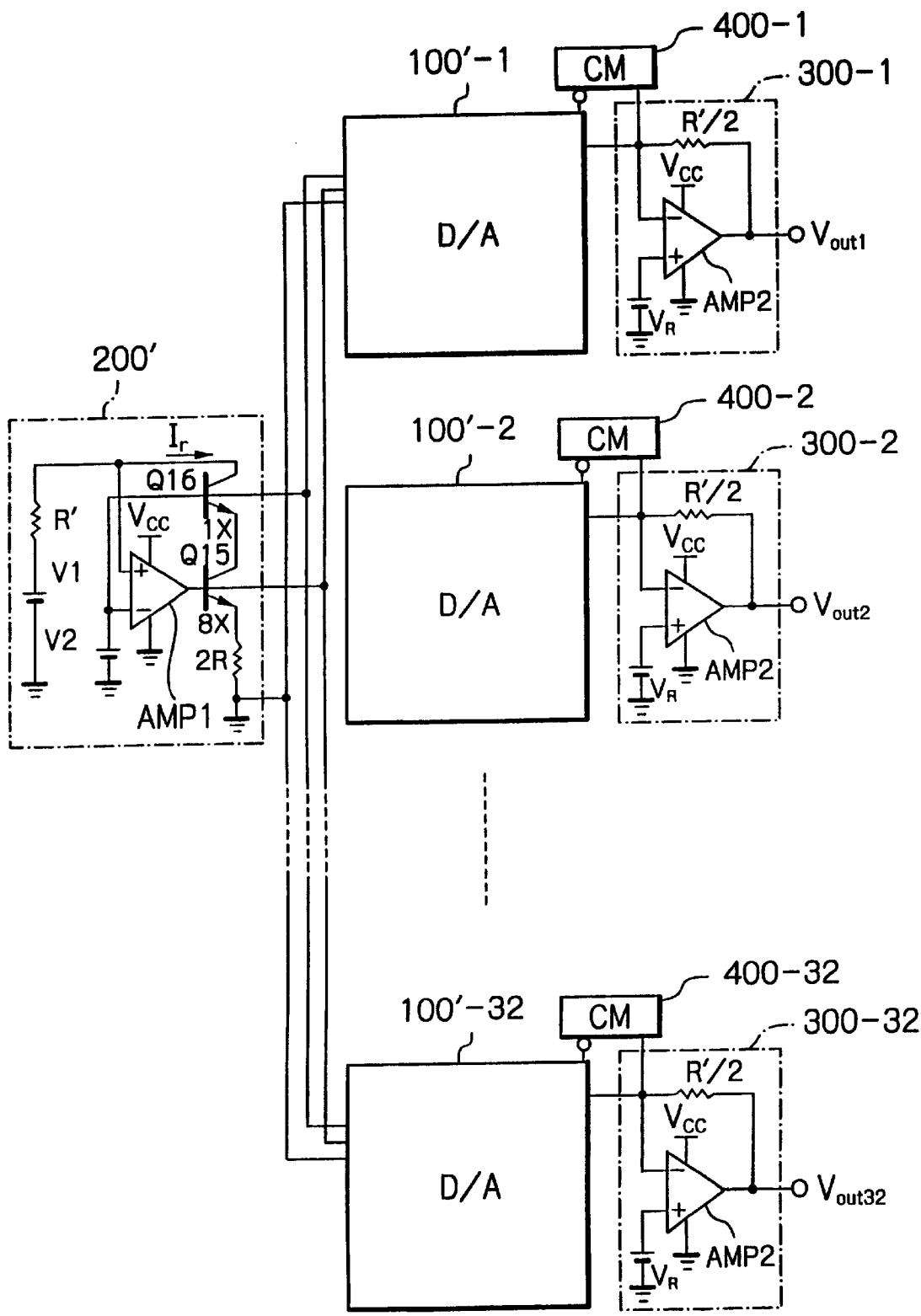
FIG. 17 is a circuit diagram illustrating a D/A converter to which a plurality of D/A converters of FIG. 6 are applied.

In FIG. 17, which is a circuit diagram illustrating a circuit including multiple D/A converters, a plurality of D/A converters of FIG. 6, i.e., 32 D/A converters of FIG. 6, are provided. In this case, 32 D/A converting sections 100'-1, 100'-2, ..., 100'-32, 32 current-to-voltage converting sections 300-1, 300-2, ..., 300-32, and 32 current mirror circuits 400-1, 400-2, ..., 400-32 are provided, but only one reference voltage generating circuit 200' is provided, thus decreasing the size of the D/A converter. In addition, the characteristics of fluctuation between the analog output voltages $V_{out1}, V_{out2}, ..., V_{out32}$ for the same digital input signal can be suppressed, thus increasing the relative accuracy between the analog output voltages $V_{out1}, V_{out2}, ..., V_{out32}$.

In the above-described embodiment, the current mirror circuit 400 can provide a high accuracy D/A conversion and a wide dynamic analog output range while the power supply voltage $V_{CC}$ can be decreased. In FIG. 4, although the current mirror circuit 400 is of a Wilson type, the current mirror circuit 400 can be of another type.

As explained hereinabove, according to the present invention, since the current switches use MOS transistors, the reference voltage generating circuit can be simplified, thus decreasing the manufacturing cost. Additionally, a control circuit for adjusting the binary data signal is unnecessary, which also simplifies the D/A converter, thus further decreasing the manufacturing cost.

Also, since an analog output current of a D/A converting section is supplied via a current mirror circuit to a current-to-voltage reference voltage generating circuit, a wide dynamic output range can be obtained while lowering the power supply voltage of the D/A converter.

What is claimed is:

1. A digital/analog converter comprising:
   a digital-to-analog converting section including a constant current source circuit having a plurality of binary-coding weighted current output terminals and including a plurality of MOS transistor type current switches driven by digital input signals, each of said MOS transistor type current switches being connected between one of said binary-coding weighted current terminals and an analog output current terminal;
   a reference voltage generating section, connected to said constant current source circuit, for generating at least one reference voltage and supplying it to said constant current source circuit; and
   a current-to-voltage converting section, connected between said analog output current terminal and an analog output voltage terminal, for converting an analog output current flowing through said analog output current terminal into an analog output voltage in response to said analog output current and supplying said analog output voltage to said analog output voltage terminal.

2. The digital/analog converter as set forth in claim 1, further comprising a current mirror circuit connected between said analog output current terminal and said current-to-voltage converting section.

3. The digital analog converter as set forth in claim 1, wherein each of said MOS transistor type current switches comprises:
   a first MOS transistor of one conductivity type having a drain connected to a power supply terminal, a gate for receiving one of said digital input signals and a source; and
   a second MOS transistor of said conductivity type having a drain connected to said analog output current terminal, a gate for receiving an inverted signal of said digital input signals and a source connected to the source of said first MOS transistor.

4. The digital analog converter as set forth in claim 1, wherein each of said MOS transistor type current switches comprises:
   a first MOS transistor of a first conductivity type having a drain connected to a power supply terminal, a gate for receiving one of said digital input signals and a source; and
   a second MOS transistor of a second conductivity type having a drain connected to said analog output current terminal, a gate for receiving said one of said digital input signals and a source connected to the source of said first MOS transistor.

5. The digital/analog converter as set forth in claim 1, wherein said constant current source circuit comprises:
   a master ladder circuit including a plurality of first binary-coding weighted constant current sources and a plurality of current compensating transistors each connected between one of said first binary-coding weighted constant current sources and one of said MOS transistor type current switches; and
   a slave ladder circuit including a plurality of second binary-coding weighted constant current sources each connected between a least significant one of said first binary-coding weighted constant current sources and one of said MOS transistor type current switches.

6. The digital/analog converter as set forth in claim 5, wherein said first binary-coding weighted current source comprises:
   a plurality of first bipolar transistors having binary-coding weighted emitter areas; and
   a first R-2R resistance ladder circuit connected to the emitters of said first bipolar transistors,
   said current compensating transistors comprising a plurality of said bipolar transistors,
   said second binary-coding weighted current sources comprising:
      a plurality of third bipolar transistors having binary-coding weighted emitter areas; and
      a second R-2R resistance ladder circuit connected to the emitters of said third bipolar transistors.

7. The digital/analog converter as set forth in claim 6, wherein said reference voltage generating section comprises:
   first and second reference voltage sources;
   a first resistor connected to said first reference voltage source;
   an operational amplifier having a first input terminal connected via said first resistor to said first reference voltage source and a second input terminal connected to said second reference voltage source;
   a fourth bipolar transistor having a base connected to an output terminal of said operational amplifier and bases of said first bipolar transistors;
   a second resistor connected between an emitter of said fourth bipolar transistor and said first R-2R resistance ladder circuit;
   a fifth bipolar transistor having a collector connected via said first resistor to said first reference voltage source, a base connected to said second reference voltage source and bases of said second and third bipolar transistors, and an emitter connected to a collector of said fourth bipolar transistor.

8. The digital/analog converter as set forth in claim 5, wherein said first binary-coding weighted current source comprises:
   a plurality of first bipolar transistors having binary-coding weighted emitter areas; and
   an R-2R resistance ladder circuit connected to the emitters of said first bipolar transistors,
   said current compensating transistors comprising a plurality of said bipolar transistors,
   said second binary-coding weighted current sources comprising:
      a plurality of third bipolar transistors having binary-coding weighted emitter areas; and
      a weighted resistance circuit connected to the emitters of said third bipolar transistors.

9. The digital/analog converter as set forth in claim 8, wherein said reference voltage generating section comprises:

first and second reference voltage sources;
a first resistor connected to said first reference voltage source;
an operational amplifier having a first input terminal connected via said first resistor to said first reference voltage source and a second input terminal connected to said second reference voltage source;
a fourth bipolar transistor having a base connected to an output terminal of said operational amplifier and bases of said first bipolar transistors;
a second resistor connected between an emitter of said fourth bipolar transistor and said R-2R resistance ladder circuit;
a fifth bipolar transistor having a collector connected via said first resistor to said first reference voltage source, a base connected to said second reference voltage source and bases of said second and third bipolar transistors, and an emitter connected to a collector of said fourth bipolar transistor.

10. A digital/analog converter comprising:
a digital-to-analog converting section for converting digital input signals into an analog output current, said digital-to-analog converting section including a master ladder circuit, a slave ladder circuit and MOS transistor type current switches connected to said master ladder circuit and said slave ladder circuit and driven by digital input signals;
a reference voltage generating section connected to said digital-to-analog converting section; and
a current-to-voltage converting section, connected to said digital-to-analog converting section, for converting said analog output current into an analog output voltage,
said master ladder circuit comprising:
  a plurality of first bipolar transistors having binary-coding weighted emitter areas;
  a first R-2R resistance ladder circuit connected to emitters of said first bipolar transistors; and
  a plurality of second bipolar transistors each having an emitter connected to a collector of one of said first bipolar transistors and a collector connected to one of said MOS transistor type current switches,
said slave ladder circuit comprising:
  a plurality of third bipolar transistors having binary-coding weighted emitter areas; and
  a second R-2R resistance ladder circuit connected to emitters of said second bipolar transistors,
  said reference voltage generating section comprising:
    first and second reference voltage sources;
    a first resistor connected to said first reference voltage source;
    an operational amplifier having a first input terminal connected via said first resistor to said first reference voltage source and a second input terminal connected to said second reference voltage source;
    a fourth bipolar transistor having a base connected to an output terminal of said operational amplifier and bases of said first bipolar transistors;
    a second resistor connected between an emitter of said fourth bipolar transistor and said first R-2R resistance ladder circuit;
    a fifth bipolar transistor having a collector connected via said first resistor to said first reference voltage source, a base connected to said second reference voltage source and bases of said second and third bipolar transistors, and an emitter connected to a collector of said fourth bipolar transistor.

11. The digital/analog converter as set forth in claim 10, further comprising a current mirror circuit connected between said digital-to-analog converting section and said current-to-voltage converting section.

12. A digital/analog converter comprising:
a digital-to-analog converting section for converting digital input signals into an analog output current, said digital-to-analog converting section including a master ladder circuit, a slave ladder circuit and MOS transistor type current switches connected to said master ladder circuit and said slave ladder circuit and driven by digital input signals;
a reference voltage generating section connected to said digital-to-analog converting section; and
a current-to-voltage converting section, connected to said digital-to-analog converting section, for converting said analog output current into an analog output voltage,
said master ladder circuit comprising:
  a plurality of first bipolar transistors having binary-coding weighted emitter areas;
  an R-2R resistance ladder circuit connected to emitters of said first bipolar transistors; and
  a plurality of second bipolar transistors each having an emitter connected to a collector of one of said first bipolar transistors and a collector connected to one of said MOS transistor type current switches,
said slave ladder circuit comprising:
  a plurality of third bipolar transistors having binary-coding weighted emitter areas; and
  a weighted resistance ladder circuit connected to emitters of said second bipolar transistors,
  said reference voltage generating section comprising:
    first and second reference voltage sources;
    a first resistor connected to said first reference voltage source;
    an operational amplifier having a first input terminal connected via said first resistor to said first reference voltage source and a second input terminal connected to said second reference voltage source;
    a fourth bipolar transistor having a base connected to an output terminal of said operational amplifier and bases of said first bipolar transistors;
    a second resistor connected between an emitter of said fourth bipolar transistor and said R-2R resistance ladder circuit;
    a fifth bipolar transistor having a collector connected via said first resistor to said first reference voltage source, a base connected to said second reference voltage source and bases of said second and third bipolar transistors, and an emitter connected to a collector of said fourth bipolar transistor.

13. The digital/analog converter as set forth in claim 12, further comprising a current mirror circuit connected between said digital-to-analog converting section and said current-to-voltage converting section.

14. A digital/analog converter comprising:
a plurality of digital-to-analog converting sections each including a plurality of binary-coding weighted constant current sources and a plurality of MOS transistor type current switches connected to said constant current sources and driven by digital input signals to generate a first analog output current in response to said digital input signals;

a single reference voltage generating section, connected to said digital-to-analog converting sections, for generating at least one reference voltage and supplying said reference voltage to said constant current sources;

a plurality of current mirror circuits, each connected to one of said digital-to-analog converting sections, for converting said first analog output current into a second analog output current in response to said first analog output current;

a plurality of current-to-voltage converting sections, each connected to one of said current mirror circuit, for converting said second analog output current into an analog output voltage in response to said second analog output current.

15. A digital/analog converter, comprising:

at least one digital-to-analog converting section receiving N bits of an input digital word to be converted into analog information, said digital-to-analog converting section comprising N current switches, each said current switch controlled by a corresponding bit of said input digital word;

a current-to-voltage converting section receiving an input current and providing an analog output voltage; and a current mirror causing a first current to mirror a second current, wherein said first current comprises the cumulative current flowing through said N current switches as controlled to indicate said bits in said input digital word, and said second current comprises said input current into said current-to-voltage converting section.

16. The digital/analog converter of claim 15, wherein said current switches comprise MOS transistors.

17. The digital/analog converter of claim 15, wherein said digital-to-analog converting section further comprises:

a plurality of transistors, said transistors having emitter areas in accordance with a binary weighting; and a binary weighted resistance ladder, wherein each of said N current switches receives a respective binary weighted input from said binary weighted resistance ladder through at least one of said transistors.

18. The digital/analog converter of claim 17, further comprising:

a constant voltage generating section to provide at least one reference voltage to drive a base of each said transistor in said digital-to-analog converting section.

19. The digital/analog converter of claim 18, wherein said constant voltage generating section comprises:

a first voltage source;

a second voltage source;

an operational amplifier having a negative input terminal, a positive input terminal, and an output terminal;

a first transistor;

a second transistor;

a first resistor; and a second resistor, wherein a first terminal of said first voltage source is connected to a first terminal of said first transistor, said positive terminal of said operational amplifier and a collector of said first transistor are connected to a second terminal of said first resistor, a first terminal of said second voltage source and a base of said first transistor are connected to said negative terminal of said operational amplifier, an emitter of said first transistor is connected to a collector of said second transistor, a base of said second transistor is connected to said output terminal of said operational amplifier, an emitter of said second transistor is connected to a first terminal of said second resistor, and a second terminal of said second resister is connected to a second terminal of said first voltage source and a second terminal of said second voltage source.

20. The digital/analog converter of claim 18, wherein said constant voltage generating section provides said at least one reference voltage to a plurality of ones of said digital-to-analog converting section.

21. A digital/analog converter comprising:

a digital-to-analog converting section including a constant current source circuit having a plurality of binary-coding weighted current output terminals and including a plurality of MOS transistor type current switches driven by digital input signals, each of said MOS transistor type current switches being connected between one of said binary-coding weighted current terminals and an analog output current terminal;

a reference voltage generating section, connected to said constant current source circuit, for generating at least one reference voltage and supplying it to said constant current source circuit; and a current-to-voltage converting section, connected between said analog output current terminal and an analog output voltage terminal, for converting an analog output current flowing through said analog output current terminal into an analog output voltage in response to said analog output current and supplying said analog output voltage to said analog output voltage terminal, wherein said constant current source circuit comprises:

a master ladder circuit including a plurality of first binary-coding weighted constant current sources and a plurality of current compensating transistors each connected between one of said first binary-coding weighted constant current sources and one of said MOS transistor type current switches.

22. The digital/analog converter of claim 21, wherein said constant current source circuit further comprises:

a slave ladder circuit including a plurality of second binary-coding weighted constant current sources each connected between a least significant one of said first binary-coding weighed constant current sources and one of said MOS transistor type current switches.

* * * * *